United States Patent [19]

Böttcher et al.

[11] Patent Number: 5,458,978

[45] Date of Patent: Oct. 17, 1995

[54] EPOXY RESIN SYSTEMS CONTAINING GLYCIDYLATED AROMATIC AMINES, PHOSPHORUS EPOXIES AND METAL SALTS

[75] Inventors: Axel Böttcher, Wesel; Jürgen Zehrfeld, Voerde; Holger Dey, Duisburg; Rolf Herzog, Bottrop, all of Germany

[73] Assignee: Rutgerswerke Atkiengesellschaft AG, Germany

[21] Appl. No.: 369,116

[22] Filed: Jan. 5, 1995

Related U.S. Application Data

[63] Continuation of Ser. No. 193,702, Feb. 8, 1994, abandoned.

[30] Foreign Application Priority Data

Feb. 10, 1993 [DE] Germany .................. 43 03 824.7

[51] Int. Cl.⁶ .................. C08G 59/40; C08G 65/00; B32B 27/38
[52] U.S. Cl. .................. 428/413; 528/27; 528/90; 528/92; 528/103; 528/108; 528/109; 528/398; 528/399
[58] Field of Search .................. 428/413; 528/90, 528/92, 103, 108, 109, 398, 399, 27

[56] References Cited

U.S. PATENT DOCUMENTS

| | | | |
|---|---|---|---|
| 2,951,822 | 9/1960 | Reinking | 549/552 |
| 5,036,135 | 7/1991 | Von Gentzkow et al. | 528/28 |
| 5,155,198 | 10/1992 | Keohan | 528/15 |

FOREIGN PATENT DOCUMENTS

| | | |
|---|---|---|
| 0408990 | 7/1990 | European Pat. Off. . |
| 0384939 | 9/1990 | European Pat. Off. . |
| 9113925 | 9/1991 | WIPO . |

*Primary Examiner*—Frederick Krass
*Attorney, Agent, or Firm*—Bierman and Muserlian

[57] ABSTRACT

An epoxy resin system comprising a) at least one nitrogen containing epoxy compound having at least two epoxy groups, b) at least one phosphorus compound with at least one epoxy group, c) at least one metallic complex compound as curing agent and d) optionally filler and additive substances free of halogenated compounds and having a low degree of inflammability.

3 Claims, No Drawings

EPOXY RESIN SYSTEMS CONTAINING GLYCIDYLATED AROMATIC AMINES, PHOSPHORUS EPOXIES AND METAL SALTS

PRIOR APPLICATION

This application is a continuation of U.S. patent application Ser. No. 08/193,702 filed Feb. 8, 1994, now abandoned.

STATE OF THE ART

Epoxy resin systems of this type are especially desirable in the field of electronics for the fabrication of printed circuit boards or of epoxy resin molding or casting compounds for coating or embedding electrical or electronic component parts. In this area of application, high Tg values of the cured products are required. Corresponding systems are known from EP-A 0 384 939 and EP-A 0 408 990. According to EP-A 0 384 939, a phosphorus-free epoxy resin, an epoxy group containing phosphorus compound and a polyfunctional isocyanate are combined and cured by means of an aminic curing agent, boron amine complex and an onium salt.

With both systems, high glass transition temperatures (Tg>160° C.) as well as low inflammability (classification according to UL 94 V: V0) are achieved. The disadvantage of both systems is that the curing process requires very long treatment at high temperatures (for example 8 hours at 150° C. and 16 hours at 200° C.). This is extremely uneconomical and furthermore causes warping of the laminate in the pressing process to form the plates for printed circuit boards, which is referred to as residual ripples, and is caused by pressing at temperatures above the Tg value.

OBJECTS OF THE INVENTION

It is an object of the invention to provide epoxy resin systems free of halogenated compounds and having a low degree of inflammability without the use of flame retardant agents such as antimony oxides.

It is an other object of the invention to provide epoxy resin systems with good physical properties, especially a high glass transition temperature which is required for classification according to V0 (Tg>160° C.) and which can be cured at significantly shorter time periods below the glass transition temperature.

These and other objects and advantages of the invention will be seen from the following detailed description.

THE INVENTION

The novel epoxy resin systems of the invention are comprised of a) at least one nitrogen containing epoxy compound having at least two epoxy groups, b) at least one phosphorus compound with at least one epoxy group, c) at least one metallic complex compound as curing agent and d) optionally filler and additive substances. These systems are preferably used in the production of plates for printed circuit boards, of prepregs for the production of fiber-reinforced formed bodies or are suitable for the coating or embedding of electrical or electronic component parts or as coating resins.

The epoxy resin systems according to the invention comprise at least one nitrogen-containing epoxy compound with at least two epoxy groups per molecule, at least one phosphorus compound with at least one, preferably at least two, epoxy groups as well as at least one metallic complex compound as curing agent. They can, moreover, comprise filler and additive substances, known per se, as accelerators, solvents, pigments or thixotropic agents but also further polyglycidylethers or epoxidized novolaks.

These epoxy resin-curing agent systems have low is flammability according to UL 94 V0 and can also be completely cured in 3 to 10 minutes at temperatures below Tg, preferably in the range from 150° to 175° C. After annealing is not necessary. The systems are exceptionally suitable for the production of prepregs. If solvents are used, solvents with a low boiling point, such as methyl ethyl ketone, can be used. On the other hand, the prepreg production can also take place without the use of solvents in a hot-melt process.

The prepregs are stable during storage at ambient temperatures for several months and the short curing times at relatively low temperature additionally permit short pressing times. The thermal after-treatment of the composite materials or circuit boards produced in this way is not necessary. Composite materials and circuit boards do not show any warping. On the other hand, they have such good mechanical and electrical properties that the corresponding circuit boards receive at least the classification FR-5.

Nitrogen-containing epoxy compounds applicable to the invention are conversion products of epichlorhydrin and di- or polyfunctional nitrogen-containing compounds. Examples are polyglycidylethers of polymeric amides or sulfonamides, of cyanuric acid, melamines, aminophenols or polyamines. Preferred polyamines are dodecylhydro-1,4,7,9'-tetraazaphenols, xylylene diamines, p-phenylene diamine, especially 4,4'-methylene dianiline and 4,4'-diaminodiphenyl sulfone.

The production of appropriate epoxy compounds takes place in a manner known per se such as described for example in Lee and Neville, Handbook of Epoxy Resins, McGraw-Hill Book Company (1967).

The preferred epoxy compounds are tetraglycidyl methylene dianiline (TGNDA) and tetraglycidyl diaminodiphenyl sulfone (TGDDS) which can be used alone or mixed with one another in any desired way.

Examples of phosphorus compounds are those having at least one epoxy group. In the curing process, these monoglycidyl phosphorus compounds lead to a break in the chain and, consequently, decrease the Tg value of the cured product. They are therefore most frequently used in a mixture with polyepoxy phosphorus compounds in quantities of maximally 10% by weight of all epoxy phosphorus compounds.

Phosphorus compounds having at least two epoxy groups can be all appropriate compounds such as are known for example from Encyclopedia of Polymer Science and Engineering (John Wiley & Sons, New York) Vol. 11, (1988), p. 144.

Particularly suitable are polyfunctional epoxy compounds with at least one substituted phosphorus or phosphorus oxide group as well as epoxy group containing phosphorus having the structure

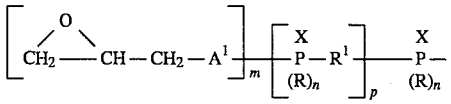

-continued

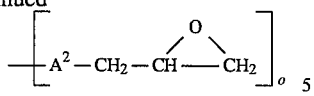

wherein m is 0 or 1, n is 0, 1 or 2, o is 1, 2 or 3 with the proviso that m+n+o=3; p is 0, 1 or 2; X is a free electron pair or O or S bound by a double bond; R is alkyl bound directly or through O or S with 1 to 4 carbon atoms, alkenyl of 2 to 3 carbon atoms, aryl, aralkyl, dialkylamino or alkylarylamino or 3-trialkylsilyl-propyl; R' is selected from the group consisting of O, S, phenylene, dioxphenylene, dioxynaphthylene, —$(CH_2)_r$—, —O—$(CH_2)_r$—, —O—$(CH_2)_r$—O—, —O—$(CH_2)_r$—$(Si(CH_3)_2$—O) $_s$—$Si(OH_3)_2(CH_2)_r$—O where r is 1 to 3 and s is 1 to 8, —(O—$CH_2$—$CH_2)_r$—O; —(O—$CH(CH_3)$—$CH_2)_t$— and —$(O(CH_2)_4)_t$—O— where t is 2 to 100 and $A^1$ and $A^2$ are individually a single bond or a bridge of $R^1$.

The epoxy resin systems of the invention can comprise the nitrogen-containing and phosphorus-containing compounds having at least two epoxy groups per molecule at a weight ratio of 10:90 to 95:5 or 50:50 to 95:5.

Each 100 parts by weight of these mixtures comprising epoxy compounds require for their curing 0.1 to 20 parts by weight of one or several metallic complex compounds of the formula

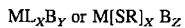

wherein M is a complex forming metal ion, L is a ligand, SR is an acid ion, B is a Lewis base, x is an integer of 1 to 8, y is an integer from 1 to 3 and z is an integer from 7 to 8. These metallic complex compounds are known from WO 91/13925.

For the production of the epoxy resin system of the invention, the nitrogen and the phosphorus-containing epoxy compounds are mixed with each other and with the complexes or a solution of the complex(es) in an organic solvent at a temperature below the initiation temperature, e.g. preferably in the range from ambient temperature to 50° C. This can take place either shortly before the further processing (curing) or also a long time before this operating step, because the mixtures have good storage properties in this temperature range and can be processed to form molding or casting compounds or prepregs.

The curing of the epoxy compounds subsequently takes place by supplying energy wherein the temperature increases above the initiation temperature of the complexes. The supply of energy can be in the form of thermal energy, light, microwaves, radiation, laser energy etc.

In the following examples, there are described several preferred embodiments to illustrate the invention. However, it is to be understood that the invention is not intended to be limited to the specific embodiments.

EXAMPLE 1

70 g of the tetraglycidylmethylene-dianiline, 30 g of diglycidylphenyl phosphoric acid ester and 30 g of a 10% solution of a complex of the formula $(COSO_4)$ [imidazole] were mixed at 40° C. and the resulting solution was used to impregnate glass fiber fleeces. The solvent was then evaporated to obtain adhesion-free prepregs which did not cure when stored at room temperature.

Eight prepregs as prepared were pressed with one another and then were cured for 5 minutes at 170° C. to produce a circuit board supporting plate which was tested from classification as FR-5. The results are reported in the following Table.

| PROPERTIES | NOMINAL VALUE | INVENTION |
|---|---|---|
| Flammability (Afterburn time after exposure to flame) | VO max. 50 s | 42 s |
| HPCT [s, no discard] | >15 | >15 |
| Surface resistance [Ohms] | >1E10 | 7.4E10 |
| Volume resistance [Ohms cm] | >5E11 | 4.8E12 |
| tan. delta | >0.035 | 0.018 |
| Dielectric constant | >5.5 | 4.9 |
| Tg [°C.] | >160 | 178 |

Various modifications of the products and method of the invention may be made without departing from the spirit or scope thereof and it is to be understood that the invention is intended to be limited only as defined in the appended claims.

What we claim is:

1. An epoxy resin comprising
   a) at least one nitrogen containing epoxy compound selected from the group consisting of tetraglycidylmethylene dianiline and tetraglycidyldiaminodiphenyl sulfone,
   b) at least one phosphorous compound of the formula

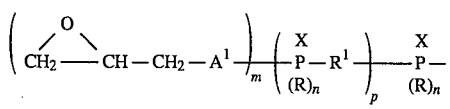

wherein m is 0 or 1, n is 0, 1 or 2, 0 is 1, 2 or 3, with the proviso that m+n+o=3; p is 0, 1 or 2; X is a free electron pair or O or S bound by a double bond; R is selected from the group consisting of alkyl of 1 to 4 carbon atoms bound directly or through O or S, alkenyl of 2 to 3 carbon atoms, aryl, aralkyl, dialkylamino, alkylarylamino and 3-trialkylsilyl-propyl; $R^2$ is selected from the group consisting of —O—, —S—, phenylene, dioxyphenylene, dioxynaphthylene, —$(CH_2)_r$—, —O—$(CH_2)_r$—, —O—$(CH_2)_r$—O—, —O—$(CH_2)_r$—$Si(CH_3)_2$—O)$_s$—$Si(CH_3)_2(CH_2)_r$—O— where r is 1 to 3 and s is 1 to 8, —(O—$CH_2$—$CH_2)_r$—O; —(O—$CH(CH_3)$—$CH_2)_t$— and —$(O(CH_2)_4)_t$—O— where t is 2 to 100 and $A^1$ and $A^2$ are individually a single bond or a bridge of $R^1$ wherein the weight ratio of a) to b) is 10:90 to 95:5, with the proviso that said phosphorus compound comprises no more than 10 percent by weight monoglycidyl component,
   c) at least one metallic complex compound of the formula

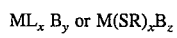

wherein M is a complex forming metal ion, L is a ligand, SR is an acid ion, B is a Lewis base, x is an integer of 1 to 8, y is an integer from 1 to 5 and z is an integer from 7 to 8 in an amount of 0.1 to 20 parts by weight of the metallic complex compound per 100 parts by weight of a) and b) and d) optionally fillers or additives.

2. A circuit board supporting plate made of an epoxy resin of claim 1.

3. A prepreg made of an epoxy resin of claim 1.

* * * * *